(12) United States Patent
Hall, Jr.

(10) Patent No.: US 6,239,351 B1
(45) Date of Patent: May 29, 2001

(54) MULTI-WIRE SELF-DIAGNOSTIC THERMOCOUPLE

(75) Inventor: Bertie Forrest Hall, Jr., Ann Arbor, MI (US)

(73) Assignee: Hoskins Manufacturing Company, Novi, MI (US)

( * ) Notice: Subject to any disclaimer, the term of this patent is extended or adjusted under 35 U.S.C. 154(b) by 0 days.

(21) Appl. No.: 09/356,850

(22) Filed: Jul. 19, 1999

Related U.S. Application Data

(63) Continuation-in-part of application No. 08/086,150, filed on Jul. 1, 1993, now Pat. No. 6,020,551.

(51) Int. Cl.$^7$ ..................................................... H01L 35/28
(52) U.S. Cl. ........................ 136/227; 136/233; 136/242; 374/179
(58) Field of Search ..................................... 136/227, 233, 136/237, 242; 374/179, 181, 182, 208

(56) References Cited

U.S. PATENT DOCUMENTS

| | | |
|---|---|---|
| 2,509,825 | 6/1950 | Keyser . |
| 2,609,406 | 9/1952 | Barsy . |
| 2,631,220 | 3/1953 | Barsy . |
| 2,696,118 | 12/1954 | Petry . |
| 3,048,641 | 8/1962 | Erlebacher . |
| 3,232,794 | 2/1966 | Korton . |
| 3,449,174 | 6/1969 | Kleinle . |
| 3,845,706 | 11/1974 | Strimple et al. . |
| 3,973,997 | 8/1976 | Solomon . |
| 3,980,504 | 9/1976 | Wagner . |
| 4,224,461 | 9/1980 | Snyder, Jr. et al. . |
| 4,450,314 | 5/1984 | Huther . |
| 4,732,619 | 3/1988 | Nanigian . |
| 5,464,485 | 11/1995 | Hall, Jr. . |

FOREIGN PATENT DOCUMENTS 675473   12/1963   (CA) .

*Primary Examiner*—Kathryn Gorgos
*Assistant Examiner*—Thomas H Parsons
(74) *Attorney, Agent, or Firm*—Brooks & Kushman P.C.

(57) ABSTRACT

A self-diagnostic thermocouple (10) having a first (12), a second (14) and a reference (16) thermoelement enclosed in a sheath (20) filled with an insulator (18) separating the thermoelectric elements from each other and the sheath. The three thermoelements (12,14,16) are joined at a common location to form three separate thermocouple junctions (22) having three distinct electrical outputs as a function of temperature. The reference thermoelement (16) is made from a pure metal or alloy which has stable thermoelectric characteristics. Deterioration of the electrical output of the self-diagnostic thermocouple (10) is capable of being detected by a programed microprocessor (100).

12 Claims, 3 Drawing Sheets

MULTI-WIRE SELF-DIAGNOSTIC THERMOCOUPLE

CROSS-REFERENCE TO RELATED APPLICATIONS

This is a continuation-in-part of application(s) Serial No. 08/086,150 filed on Jul. 1, 1993, now U.S. Pat. No. 6,020,551, issued Jan. 1, 2000, entitled Multi-Wire Self-Diagnostic Thermocouple which is incorporated herein by reference.

BACKGROUND OF THE INVENTION

1. Field of the Invention

This invention is related to the field of thermocouples and in particular to a three-wire self-diagnostic thermocouple which permits detection of calibration changes.

2. Description of the Related Art

A change in the calibration of a thermocouple can cause an error in the detection of the temperature to be determined or controlled. In particular, where equipment is being controlled by a thermocouple, this error could result in the equipment being damaged. Additionally, when the thermocouple controls a process, this error could result in the failure of the process to produce the desired product.

Currently, the accuracy of an installed thermocouple can be assured by placing a second thermocouple of known calibration beside the installed thermocouple and comparing the measured temperatures. This method is not always easy or possible to do and requires periodic checking to be effective. Additionally, it is not conveniently possible to know with certainty which of the two thermocouples is faulty when the two thermocouples indicate different temperatures.

The use of two thermocouple elements within a metal sheath is taught by Burley in U.S. Pat. No. 4,909,855, by Thom et al. in U.S. Pat. No. 4,778,537 and by Hollander in U.S. Pat. No. 5,111,002. Synder Jr. et al. in U.S. Pat. 4,224,461 teach a two wire thermocouple which includes a third wire as a ground wire. Petry in U.S. Pat. No. 2,696,118 teaches a temperature indicating device having two thermocouples in which the two thermocouples have a common element. Further, Bock in Canadian Patent 675,473 teaches that at least four thermocouple junctions are required to eliminate ambiguity from the measured temperature.

SUMMARY OF THE INVENTION

A self-diagnostic thermocouple is disclosed, consisting of a first thermoelement having first thermoelectric output properties, a second thermoelement having second thermoelectric output properties, and a reference thermoelement having stable reference thermoelectric output characteristic. A common junction of the first, second, and reference thermoelement, forms three discrete thermocouple junctions. Preferably, the first, second, and reference thermoelements are enclosed in a sheath and are separated from each other and the sheath by insulating materials.

A first object of the invention is to provide a self-diagnostic thermocouple which can be used to identify when an output of the thermocouple has deteriorated.

A second object of the invention is to provide a three wire thermocouple in which one of the three thermoelements is a reference thermoelement having thermoelectric output characteristics which are stable over time.

Another object of the invention is to provide a self diagnostic thermocouple in which the reference thermoelement is a pure metal such as gold, platinum, iron or copper.

Still another object of the invention is to provide a thermocouple system having a self diagnostic thermocouple and a microprocessor for detecting the deterioration of the thermoelectric properties.

These and other objects will become more apparent from a reading of the specification in conjunction with the appended drawings.

DETAILED DESCRIPTION OF THE INVENTION

Figure 1:
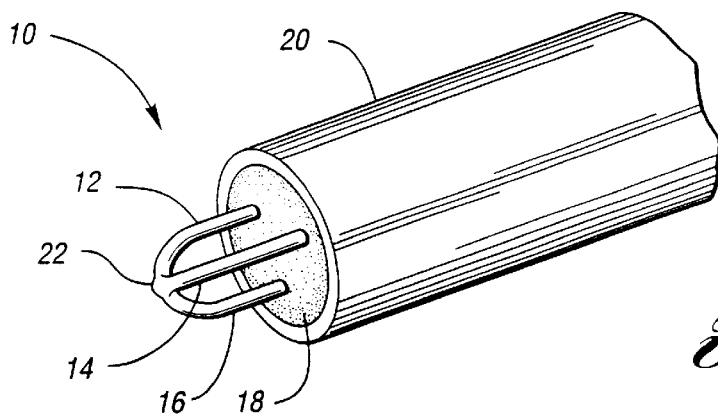
FIG. 1 is a perspective view of the self-diagnostic thermocouple.
Figure 2:
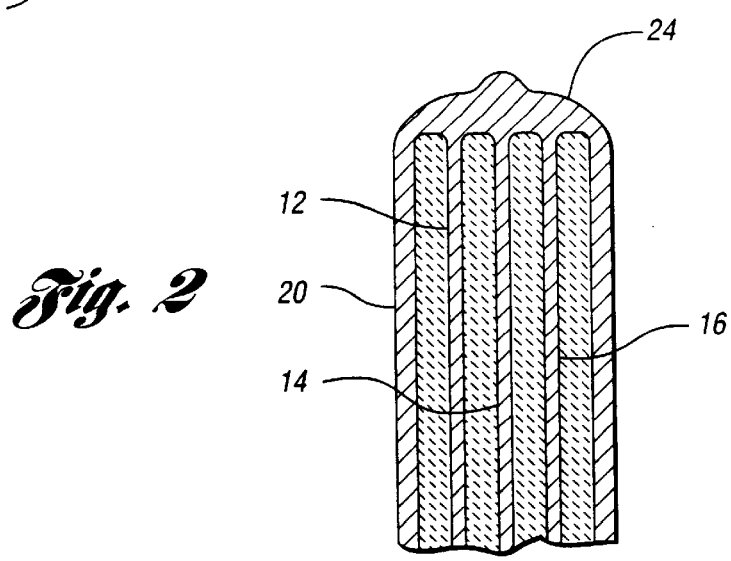
FIG. 2 is a longitudinal cross-sectional view showing the thermocouple junction fused to the sheath.

Referring to FIG. 1, there is shown a multi-wire self-diagnostic thermocouple 10 having three thermoelements 12, 14 and 16 enclosed in a single sheath 20 preferably made of a metal or other electrically conductive material. The thermoelements 12, 14, and 16 are insulated from each other and from the sheath 20 by a ceramic or mineral insulating material 18. One end of the three thermoelements 12, 14 and 16 may be fused to the ends of the other thermoelements, as indicated by bead 22, to form three thermocouple junctions. The bead 22 is preferably a weld bead fusing the ends of the three thermoelements to each other. Alternatively, the ends of the three thermoelements may be fused to each other and to the sheath 20 as indicated in FIG. 2 to form and seal the end 24 of the self-diagnostic thermocouple. Two of the three thermoelements 12 and 14, respectively, may be made from any of the dissimilar metals or alloys known in the thermocouple art, such as ALUMEL®, a nickel-base alloy containing Si, Al and Mn CHROMEL®, a nickel-chromium alloy constantan or platinum alloys, such as platinum-10% rhodium. The third thermoelement 16 is a reference thermoelement made from a pure noble or base metal and alloys such as 310 stainless steel or other alloys having a stable EMF (electromotive force) output verses temperature characteristic, such as pure gold, platinum, rhodium, iron and copper.

Figure 3:
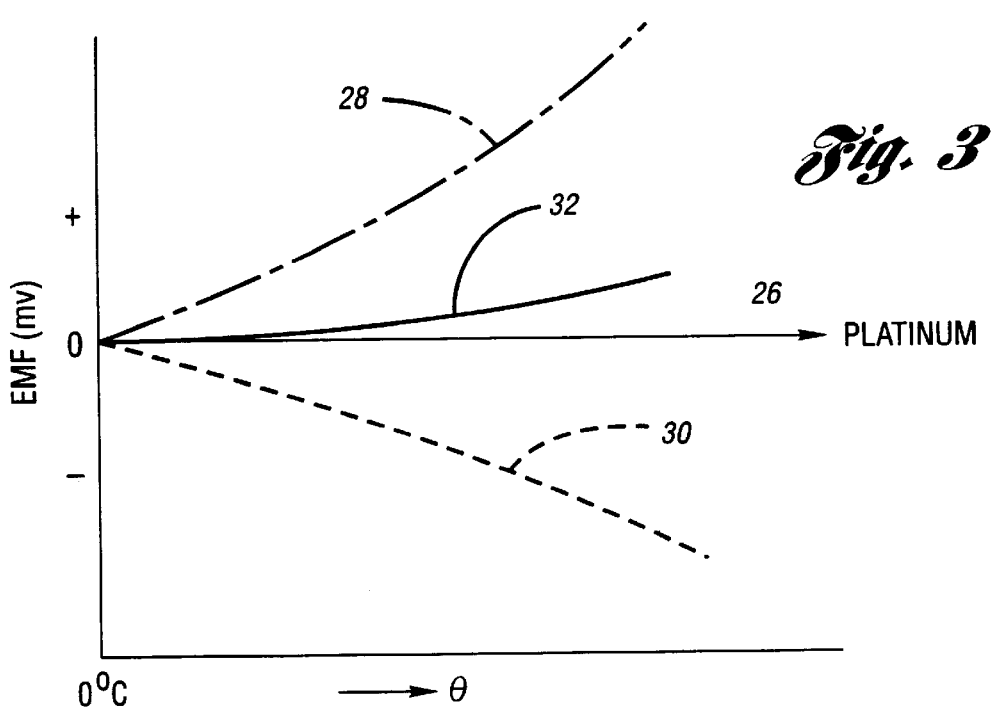
FIG. 3 is a graph showing the thermoelectric output characteristics of a first, second, and reference thermoelectric element.

Preferably, the EMF output versus temperature characteristics of the first two thermoelements are of opposite polarity with reference to the reference thermoelement 16, as shown on FIG. 3. However, it is possible that the EMF output versus temperature characteristics of the first two thermoelements may have the same polarity with reference to the reference thermoelement. Still referring to FIG. 3, the EMF output versus temperature characteristics curve 26 of platinum is used as a zero reference. The characteristics of a first thermoelement 12, such as CHROMEL®, are indicated by curve 28. The emf versus temperature characteristics of the second thermoelement 14, such as ALUMEL®, is indicated by curve 30 and the EMF output versus temperature of the reference thermoelement 16, such as pure iron (Fe) is indicated by curve 32. CHROMEL® and ALUMEL® are registered trade marks of the Hoskins Manufacturing Co. of Detroit, Mich. The compositions of CHROMEL® and ALUMEL® are well known in the art and may be found in numerous publications such as the *Manual On the Use of Thermocouples in Temperature Measurements*, published by the American Society of Testing and Materials (ASTM), Special Technical Publication 470B, printed in July 1981. These compositions are incorporated herein by reference, and for brevity are not repeated herein.

Figure 4:
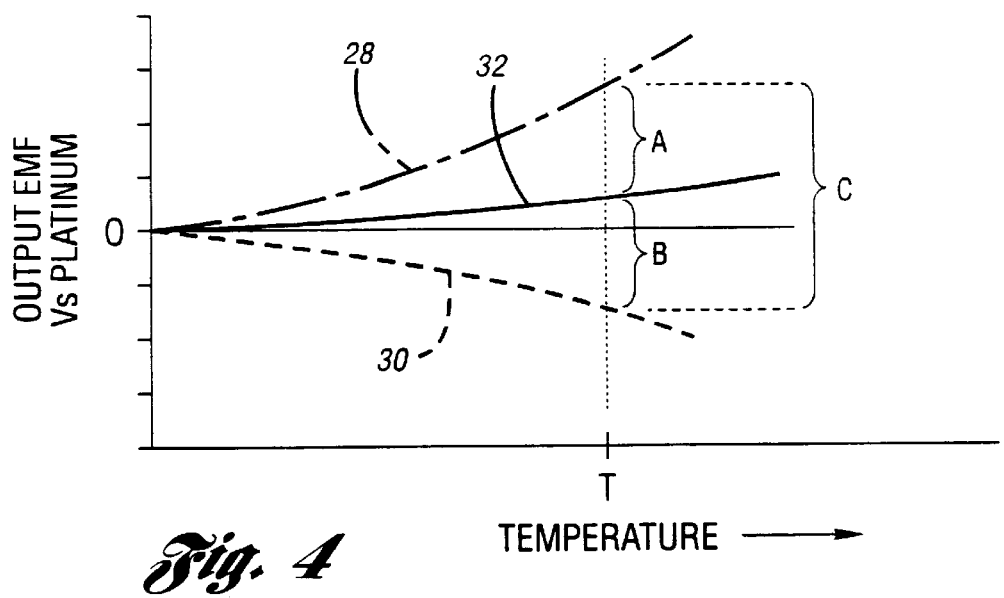
FIG. 4 is a graph illustrating the change in the output of the thermocouple junctions as a function of temperature.

The connected ends of the three thermoelements form three thermocouple junctions. The electrical outputs at any temperature $\theta$ are represented by the difference between the electrical outputs of the corresponding thermoelements. For example, as shown in FIG. 4, an electrical output A (curves 28, 32) emanates from the thermocouple junction formed by the CHROMEL® thermoelement 12 and the iron reference thermoelement 16. An electrical output B (curves 32, 30') is the output of the thermocouple junction formed between the ALUMEL® thermoelement 14 and the reference thermoelement 16. A third electrical output C (curves 28, 30') is the output of the junction formed between the ALUMEL® thermoelement 14 and the CHROMEL® thermoelement 12 as shown in FIG. 4.

Table 1 gives the results of a drift test of a type K thermocouple junction formed between an ALUMEL® thermoelement and a CHROMEL® thermoelement as a function of time at a temperature of approximately 2300° F. A type S platinum-platinum 10% rhodium reference thermocouple was used to make an accurate temperature measurement in degrees Fahrenheit (° F.). An initial offset of 12.6° F. was measured at the beginning of the tests which is the result of departure of the CHROMEL®/ALUMEL® thermocouple from the standardized table for the type K thermocouple.

TABLE I

| Time (Hrs.) | Actual Test Temp. ° F. Type S Reference T/C (° F.) | Test T/C Type K (° F.) | Test T/C Error (° F.) Type K Error (° F.) |
|---|---|---|---|
| 0.0 | 2291.5 | 2278.9 | −12.6 |
| 5.0 | 2295.1 | 2275.1 | −20.0 |
| 10.0 | 2293.7 | 2271.3 | −22.3 |
| 15.0 | 2299.6 | 2276.1 | −23.5 |
| 20.0 | 2288.6 | 2266.2 | −22.3 |
| 25.0 | 2272.7 | 2248.6 | −23.9 |

TABLE I-continued

| Time (Hrs.) | Actual Test Temp. ° F. Type S Reference T/C (° F.) | Test T/C Type K (° F.) | Test T/C Error (° F.) Type K Error (° F.) |
|---|---|---|---|
| 30.0 | 2288.4 | 2259.0 | −29.4 |
| 35.0 | 2304.1 | 2277.6 | −26.3 |
| 40.0 | 2290.3 | 2267.0 | −23.3 |

As indicated by the test data presented in Table I, the temperature measured by the K type thermocouple had a temperature error which changed from −12.6° F. to −29.4° F. in 30 hours.

In many control applications, a temperature measurement error of this magnitude may be unacceptable. Since the individual thermoelements are alloys of different composition, oxidation and evaporation of minor elements will change the thermoelectric properties of each thermoelement in a unique direction and magnitude. As a function of time, the calibration of the thermoelements may change such that the error in the measured temperature may exceed desired limits.

Absent a stable reference thermocouple such as the S type thermocouple used in this test, the error in the temperature measurement by the K type thermocouple will go undetected.

Table II was obtained by simultaneously reading the three outputs of the self-diagnostic thermocouple according to the invention. In this test, the reference thermoelectric element was a platinum element and the actual temperature was measured using a type S thermocouple. The first column is test time in hours, the second, third and fourth columns are the standardized table values in millivolts (Mv) for CHROMEL®-platinum (Kp) thermocouple, the ALUMEL®-platinum (Kn) thermocouple, and the CHROMEL®-ALUMEL® (type K) thermocouple respectively for the temperature measured by the S type reference thermocouple. The next two columns give the measured EMF output of the Kp type thermocouple and the error between the measured output and the standardized table value. In a like manner, the next two columns give the measured EMF output of the Kn type thermocouple and the error between the measured output and the standardized table output. The penultimate and last columns give the type K thermocouple error in millivolts and ° F., respectively.

TABLE II

| Time (hrs.) | Std. Kp EMF (Mv) | Std. Kn EMF (Mv) | Std. K EMF @ S Temp ° F. | Test Kp EMF (Mv) | Error EMF (Mv) | Test Kn EMF (Mv) | Error EMF (Mv) | Type K T/C Error (Mv) | Error ° F. |
|---|---|---|---|---|---|---|---|---|---|
| 0 | 40.104 | 10.728 | 50.832 | 39.989 | −0.115 | 10.59 | 0.138 | −0.253 | −12.6 |
| 5 | 40.161 | 10.742 | 50.903 | 39.92 | −0.241 | 10.585 | 0.157 | −0.398 | −20 |
| 10 | 40.139 | 10.737 | 50.876 | 39.883 | −0.256 | 10.547 | 0.19 | −0.446 | −22.3 |
| 15 | 40.232 | 10.761 | 50.992 | 39.978 | −0.254 | 10.545 | 0.216 | −0.47 | −23.5 |
| 20 | 40.058 | 10.717 | 50.775 | 39.823 | −0.235 | 10.505 | 0.212 | −0.447 | −22.3 |
| 25 | 39.805 | 10.654 | 50.459 | 39.554 | −0.251 | 10.427 | 0.227 | −0.478 | −23.9 |
| 30 | 40.054 | 10.716 | 50.771 | 39.835 | −0.219 | 10.358 | 0.358 | −0.577 | −29.1 |
| 35 | 40.304 | 10.778 | 51.081 | 40.061 | −0.243 | 10.496 | 0.282 | −0.525 | −26.3 |
| 40 | 40.085 | 10.723 | 50.808 | 39.823 | −0.262 | 10.519 | 0.204 | −0.466 | −23.3 |

Logging or measuring the Kp, Kn and K outputs simultaneously can qualify the thermoelectric stability of the K type thermocouple and indicate whether calibration changes are causing high or low errors in the measured temperature.

Figure 5:
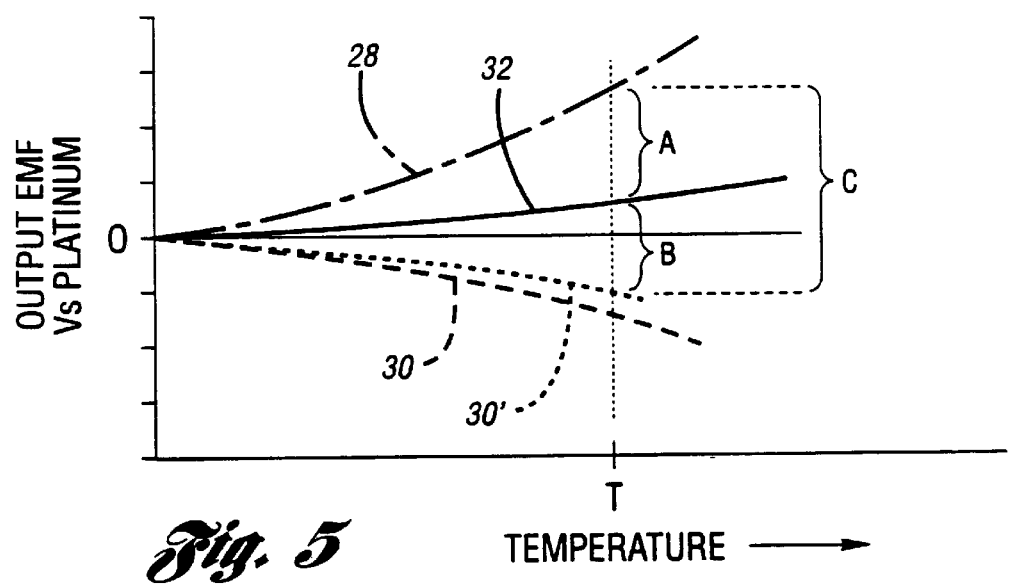
FIG. 5 is a graph corresponding to FIG. 4 in which one of the thermoelements has deteriorated.

As indicated in FIG. 5, for example, if the EMF output of ALUMEL® thermoelement 14 deteriorates, as indicated by dashed curve 30', the output B of the thermocouple junctions between the ALUMEL® thermoelement 14 and the pure iron thermoelement 16 will be decreased from the calibration value B shown in FIG. 4. In a like manner, the output C of the thermocouple junction formed between the CHROMEL® and ALUMEL® thermoelements will also decrease. However, the output A from the thermocouple junction formed between the CHROMEL® thermoelement 12 and the reference iron thermoelement 16 may remain relatively unchanged.

Figure 6:
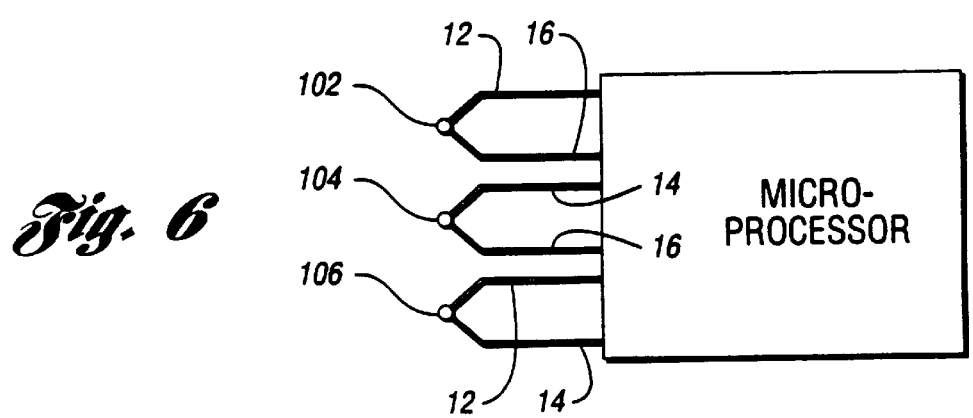
FIG. 6 is a block diagram of a detection system embodying a self-diagnostic thermocouple and a microprocessor.

Since the reference iron thermoelement 16 is very stable, a deterioration of either or both of the other two thermoelements can readily be detected by comparing the outputs A and B. The deterioration of one thermoelement of the self-diagnostic thermocouple may be detected using a programmed microprocessor, as shown in FIG. 6. In this example, the self-diagnostic thermocouple consists of three thermocouple junctions depicted as thermocouple junctions 102, 104 and 106. Thermocouple junction 102 consists of the junction of thermoelements 12 and 16, while thermocouple junction 104 consists of the junction between thermoelements 14 and 16 and thermocouple junction 106 consists of the junction between thermoelements 12 and 14. In the arrangement shown in FIG. 6, the thermoelement 16 is a reference thermoelement. The three thermocouple junctions 102, 104 and 106 and their associated thermoelements are shown separately in FIG. 6 for simplicity, even though the self-diagnostic thermocouple according to the invention consists of only three thermoelements.

The microprocessor 100 may be a general purpose programed microprocessor used to control an oven or possibly to control a process in which the electrical outputs of the self-diagnostic thermocouple are included as measured parameters. Alternatively, the microprocessor may be a processor dedicated to the detection and determination of a temperature. The microprocessor 100 includes at least one look-up table, data interpolation capabilities and comparison capabilities.

Figure 7:
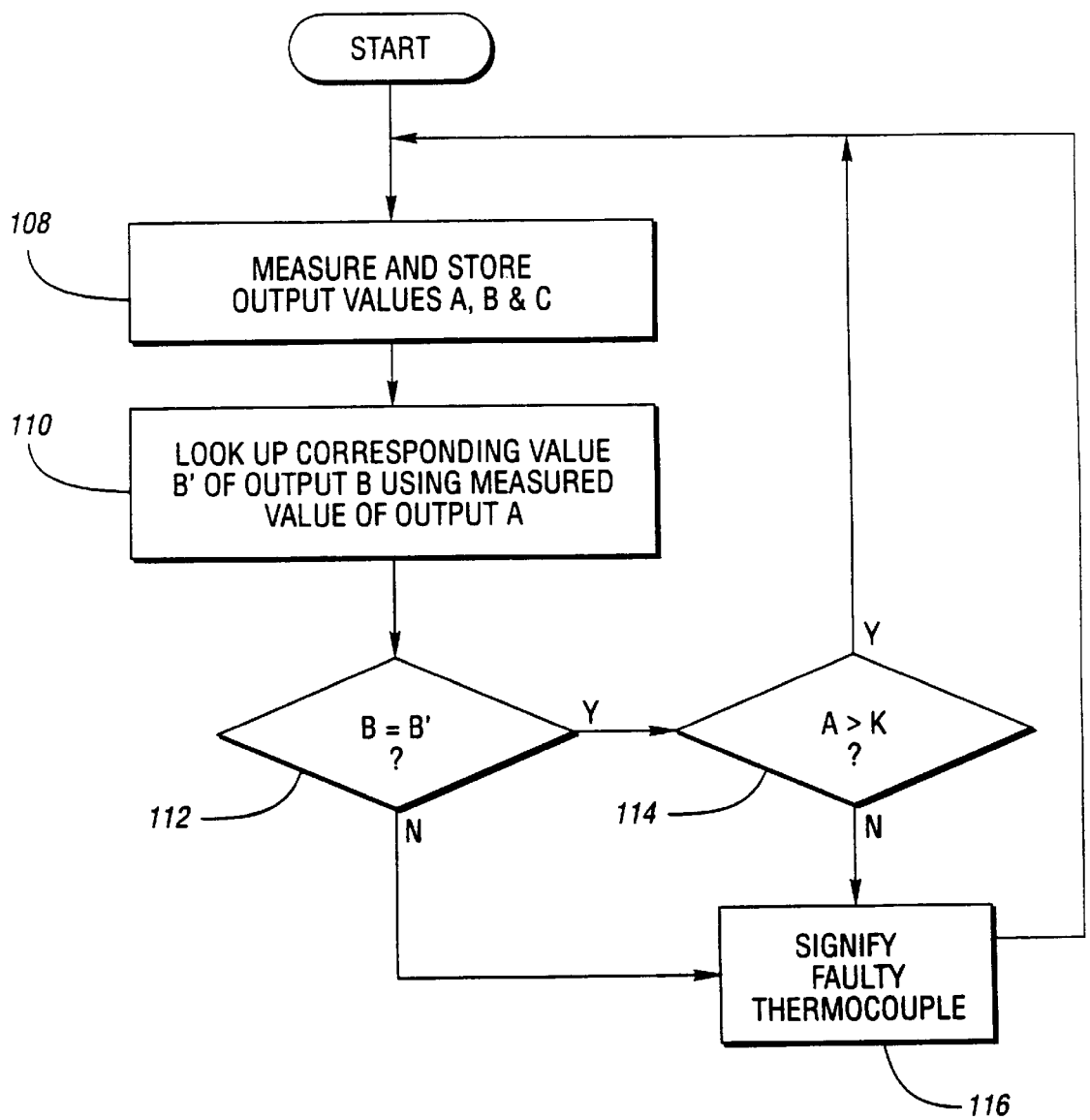
FIG. 7 is a flow diagram of the process executed by the microprocessor.

The operation of the microprocessor will be discussed relative to the flow diagram shown in FIG. 7. The microprocessor 100 will first measure the outputs of each of the thermocouple junctions 102, 104 and 106 identified as junctions A, B and C respectively in block 108. The microprocessor will then look up the value B' corresponding to the expected value of thermocouple junction 104 based on the actual output value A. Next, the microprocessor 100 will compare the actual or measured value B of thermocouple junction 104 with the expected value B' of thermocouple junction 104 as derived from a look-up table (indicated in decision block 112). If B=B', the microprocessor will check to assure that the value of A is greater than a predetermined value K (indicated in block 114) to assure that the diagnostic thermocouple is not broken or disconnected. If the value of A is equal to or greater than K, the microprocessor will return to block 108 and the process will be repeated. If A is not greater than K, the microprocessor will signify a failure of the self-diagnostic thermocouple as indicated by block 116.

If the value of B is not equal to the value of B' within predetermined limits, the microprocessor will again signify a failure of the self diagnostic thermocouple (as indicated in block 116). The microprocessor may signify a failure by energizing a visual alarm such as a steady or blinking red light or actuate an audio alarm or both.

It is recognized that the microprocessor may execute different programs from those discussed above to detect a malfunction of the diagnostic thermocouple.

Having disclosed the structure and method of operation of the self-diagnostic thermocouple, it is recognized that those skilled in the art may make certain changes or improvements within the scope of the appended claims.

What is claimed is:

1. A self-diagnostic thermocouple for detecting the deterioration of a thermoelement comprising:
   a sheath;
   a first thermoelement having first thermoelectric properties, disposed at least partially axially within the sheath;
   at least a second thermoelement disposed at least partially axially within the sheath, having second thermoelectric properties different from the first thermoelectric properties;
   a reference thermoelement disposed at least partially axially within the sheath, the reference thermoelement having thermoelectric properties different from the first and at least second thermoelectric properties;
   an insulating material filling the sheath for electrically insulating the first, second and reference themoelements from each other and from the sheath; and
   a microprocessor responsive to at least two of the electrical outputs to generate an output signifying a degradation of one of the first and at least second thermoelements.

2. The self-diagnostic thermocouple of claim 1 wherein the sheath is an electrically conductive sheath.

3. The self-diagnostic thermocouple of claim 2 wherein the first thermoelectric properties have a positive value relative to the thermoelectric properties of the reference thermoelement;
   the second thermoelectric properties of the second thermoelement are negative with respect to the thermoelectric properties of the reference thermoelement; and
   the thermoelectric properties of the reference thermoelement are intermediate the first and second thermoelectric properties.

4. The self-diagnostic thermocouple of claim 3 wherein the reference thermoelement is made from a pure metal selected from the group consisting of platinum, gold, iron and copper.

5. The self-diagnostic thermocouple of claim 4 wherein the first and second thermoelements are made from an alloy selected from the group consisting of a nickel-base alloy containing Si, Al and Mn; a nickel-chromium alloy; platinum 10% rhodium, platinum 13% rhodium, constantin, and mixtures thereof.

6. The self-diagnostic thermocouple of claim 1 having the first, second and reference thermoelements joined to each other at one end thereof to form three thermocouple junctions.

7. The self-diagnostic thermocouple of claim 6 wherein one end of each of the first, second and reference thermoelements are fused to each other to form a bead, the bead forming three thermocouple junctions, each of the three thermocouple junctions producing an electrical output which varies as a function of temperature.

8. A self-diagnostic thermocouple comprising:

a sheath;

a first thermoelement disposed at least partially axially within the sheath having first thermoelectric properties;

at least a second thermoelement disposed at least partially axially within the sheath having second thermoelectric properties different from the first thermoelectric properties;

a reference thermoelement disposed at least partially axially within the sheath, the reference thermoelement having thermoelectric properties different from the first and second thermoelectric properties; and an insulating material filling the sheath for electrically insulating the first, second and reference thermoelements from each other and from the sheath;

wherein the sheath is an electrically conductive sheath; and wherein the sheath is a metal sheath, and one end of the first, second and reference thermoelectric elements are fused to each other and to the metal sheath.

9. A self-diagnostic thermocouple system comprising:

a first thermoelectric element having first thermoelectric properties;

a second thermoelectric element having second thermoelectric properties different from the first thermoelectric properties;

a reference thermoelement having stable thermoelectric properties;

a connection of the first, second and reference thermoelements forming three thermocouple junctions, the three thermocouple functions respectively having three electrical outputs; and a microprocessor responsive to at least two of the three electrical outputs to generate an output signifying a degradation of one of the first and second thermoelements.

10. The thermocouple system of claim 9 wherein the at least two thermocouple junctions comprise a first thermocouple junction formed between the first and the reference thermoelements; and a second thermocouple junction formed between the second and the reference thermoelements.

11. The thermocouple system of claim 10 wherein the microprocessor includes:

a look-up table storing at least the expected electrical output values of the second thermocouple junction as a function of the electrical output of the first thermocouple junction;

means responsive to the measured value of the first electrical output to address the look-up table to generate an anticipated electrical output value of the second output;

a comparator responsive to the electrical expected output differing from a measured electrical output of the second thermocouple junction to generate an error signal indicating a deterioration of at least one of the first and second thermoelectric elements.

12. The thermocouple system of claim 10, further including a second comparator responsive to the measured and anticipated electrical outputs being equal to signify an error when the value of the first electrical output is less than a predetermined value.

* * * * *